US006574104B2

(12) United States Patent
Patel et al.

(10) Patent No.: US 6,574,104 B2
(45) Date of Patent: Jun. 3, 2003

(54) SMART COOLING OF DATA CENTERS

(75) Inventors: Chandrakant D. Patel, Fremont, CA (US); Cullen E. Bash, San Francisco, CA (US); Abdlmonem H. Beitelmal, Sacramento, CA (US)

(73) Assignee: Hewlett-Packard Development Company L.P., Houston, TX (US)

( * ) Notice: Subject to any disclaimer, the term of this patent is extended or adjusted under 35 U.S.C. 154(b) by 0 days.

(21) Appl. No.: 09/970,707

(22) Filed: Oct. 5, 2001

(65) Prior Publication Data

US 2003/0067745 A1 Apr. 10, 2003

(51) Int. Cl.⁷ ................................................. H05K 7/20
(52) U.S. Cl. ........................ 361/695; 62/259.2; 62/263; 165/80.3; 165/104.33; 454/184
(58) Field of Search ................................ 62/259.2, 263; 165/80.3, 104.33, 121–122, 126; 236/49.1–49.5; 361/688–696, 700–702; 454/184

(56) References Cited

U.S. PATENT DOCUMENTS

| | | | | |
|---|---|---|---|---|
| 5,467,609 A | * | 11/1995 | Feeney | 62/259.2 |
| 5,718,628 A | * | 2/1998 | Nakazato et al. | 454/184 |
| 5,956,228 A | * | 9/1999 | Zahorsky et al. | 361/695 |
| 6,142,866 A | * | 11/2000 | Wright | 454/184 |
| 6,374,627 B1 | * | 4/2002 | Schumacher et al. | 62/259.2 |
| 6,412,292 B2 | * | 7/2002 | Spinazzola et al. | 62/259.2 |

FOREIGN PATENT DOCUMENTS

JP         4022547797    * 10/1990   ................. 361/694

* cited by examiner

Primary Examiner—Gregory Thompson

(57) ABSTRACT

A cooling system is configured to adjust cooling fluid flow to various racks located throughout a data center based upon the detected or anticipated temperatures at various locations throughout the data center. In one respect, by substantially increasing the cooling fluid flow to those racks dissipating greater amounts of heat and by substantially decreasing the cooling fluid flow to those racks dissipating lesser amounts of heat, the amount of energy required to operate the cooling system may be relatively reduced. Thus, instead of operating the devices, e.g., compressors, fans, etc., of the cooling system at substantially 100 percent of the anticipated heat dissipation from the racks, those devices may be operated according to the actual cooling needs. In addition, the racks may be positioned throughout the data center according to their anticipated heat loads to thereby enable computer room air conditioning (CRAC) units located at various positions throughout the data center to operate in a more efficient manner. In one respect, the positioning of the racks may be determined through implementation of numerical modeling and metrology of the cooling fluid flow throughout the data center. In addition, the numerical modeling may be implemented to control the volume flow rate and velocity of the cooling fluid flow through each of the vents.

29 Claims, 6 Drawing Sheets

SMART COOLING OF DATA CENTERS

FIELD OF THE INVENTION

This invention relates generally to cooling systems for data centers. More particularly, the invention pertains to a smart cooling system for delivering controlled amounts of cooling fluid, e.g., air, to various areas of a data center.

BACKGROUND OF THE INVENTION

A data center may be defined as a location, e.g., room, that houses numerous printed circuit (PC) board electronic systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of PC boards, e.g., about forty (40) boards, with future configurations of racks being designed to accommodate up to eighty (80) boards. The PC boards typically include a number of components, e.g., processors, micro-controllers, high speed video cards, memories, semi-conductor devices, and the like, that dissipate relatively significant amounts of heat during the operation of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. That is, cooling fluid is supplied to the components at around 100 percent of the estimated cooling requirement. In this respect, conventional cooling systems often attempt to cool components that may not be operating at a level which may cause its temperature to exceed a predetermined temperature range. Consequently, conventional cooling systems often incur greater amounts of operating expenses than may be necessary to sufficiently cool the heat generating components contained in the racks of data centers.

SUMMARY OF THE INVENTION

According to one aspect, the present invention pertains to a smart cooling system for cooling racks in a data center. The system includes a cooling device for supplying cooling fluid to the racks. The cooling device includes a variable output fan and a variable capacity compressor. The system also includes a plenum having an inlet and a plurality of outlets, in which the inlet of the plenum is in fluid communication with the fan. A plurality of vents for delivering the cooling fluid to the racks is also included in the system. The vents are operable to vary a characteristic of the cooling fluid delivered through each of the vents.

According to another aspect, the present invention pertains to a method of cooling a plurality of racks in a data center. In the method, a cooling system is activated and a plurality of vents are opened. Each of the vents is configured to supply cooling fluid to at least one of the racks. The temperatures of each of the racks are sensed and it is determined whether the sensed temperatures are within a predetermined temperature range. In addition, the supply of the cooling fluid to the racks is varied in response to the sensed temperatures.

According to yet another aspect, the present invention relates to a data center housing a plurality of racks. The data center includes a raised floor having a plurality of vents and a plenum located beneath the raised floor. The data center also includes a cooling system having a variable capacity compressor and a variable output fan and the cooling system is configured to supply a cooling fluid into the plenum. The plenum is in fluid communication with the plurality of vents which are configured to deliver the cooling fluid to the racks. The vents are operable to vary a characteristic of the cooling fluid delivered through each of the vents. A divider is positioned within the plenum and operates to divide the plenum into a first chamber and a second chamber. The first chamber of the plenum is in fluid communication with the cooling system and the second chamber is in fluid communication with the vents. The divider operates to maintain the pressure of the cooling fluid in the second chamber at a substantially uniform pressure. The data center further includes at least one vent controller operable to control at least one of the vents. The at least one vent controller is configured to independently control the vents to thereby independently vary the characteristic of the cooling fluid flow through the vents. In addition, the data center includes a cooling system controller operable to control a speed of the compressor and an output of the fan to thereby vary the output of the cooling fluid from the cooling system to thereby vary the cooling fluid supply in the plenum.

In comparison to known data center cooling mechanisms and techniques, certain embodiments of the invention are capable of achieving certain aspects, including some or all of the following: (1) substantially focalized supply of cooling fluid to individual racks; (2) substantially independent control of the fluid supply to the racks; (3) energy efficient utilization of a cooling system by operating them substantially only as needed; (4) cooling fluid supply may be individually varied in accordance with actual or anticipated temperatures of the heat generating components; and (5) the costs associated with operating the cooling system of the invention may be substantially lower than with operating conventional cooling systems. Those skilled in the art will appreciate these and other benefits of various embodiments of the invention upon reading the following detailed description of a preferred embodiment with reference to the below-listed drawings.

BRIEF DESCRIPTION OF THE DRAWINGS

Features and advantages of the present invention will become apparent to those skilled in the art from the following description with reference to the drawings, in which.

DETAILED DESCRIPTION OF THE INVENTION

For simplicity and illustrative purposes, the principles of the present invention are described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structure have not been described in detail so as not to unnecessarily obscure the present invention.

According to a preferred embodiment of the present invention, a cooling system is configured to adjust cooling fluid, e.g., air, flow to various racks located throughout a data center, e.g., location that houses numerous printed circuit (PC) board electronic systems arranged in a number of racks, based upon the detected or anticipated temperatures at various locations throughout the data center. In one respect, by substantially increasing the cooling fluid flow to those racks dissipating greater amounts of heat and by substantially decreasing the cooling fluid flow to those racks dissipating lesser amounts of heat, the amount of energy required to operate the cooling system may be relatively reduced. Thus, instead of operating the devices, e.g., compressors, fans, etc., of the cooling system at substantially 100 percent of the anticipated heat dissipation from the racks, those devices may be operated according to the actual cooling needs. In addition, the racks may be positioned throughout the data center according to their anticipated heat loads to thereby enable computer room air conditioning (CRAC) units located at various positions throughout the data center to operate in a more efficient manner. In another respect, the positioning of the racks may be determined through implementation of modeling and metrology of the cooling fluid flow throughout the data center. In addition, the numerical modeling may be implemented to determine the volume flow rate and velocity of the cooling fluid flow through each of the vents.

Figure 1:
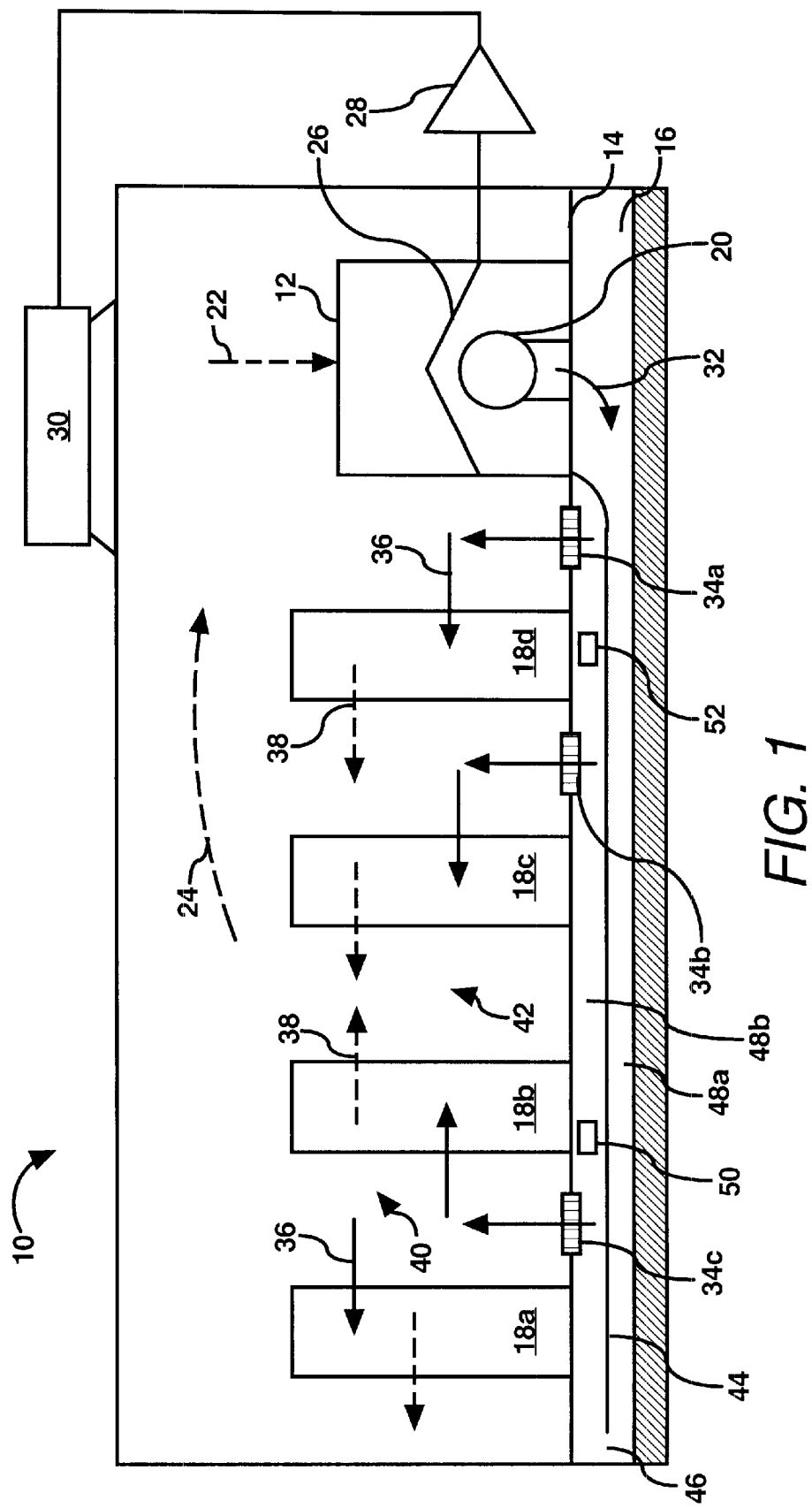
FIG. 1 shows a simplified schematic illustration of a data center containing a cooling system in accordance with an embodiment of the invention.

FIG. 1 shows a simplified schematic illustration of a data center 10 containing a cooling system 12. The data center 10, according to this preferred embodiment of the invention, includes a raised floor 14. A plurality of wires and communication lines (not shown) may be located in the space 16 beneath the raised floor 14. In addition, the space 16 may function as a plenum to deliver cooling fluid from the cooling system 12 to a plurality of racks 18a–18d. Although the data center 10 is illustrated in FIG. 1 as containing four racks 18a–18d and a cooling system 12, it should be understood that the data center may include any number of racks, e.g., 100 racks, and cooling systems, e.g., four or more. The illustration of four racks is for illustrative and simplicity of description purposes only and is not intended to limit the present invention in any respect.

The racks 18a–18d generally house a plurality of components (not shown), e.g., processors, micro-controllers, high speed video cards, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, generally dissipate relatively large amounts of heat. Because racks 18a–18d have been generally known to include upwards of forty (40) or more subsystems, they may require substantially large amounts of cooling fluid to maintain the subsystems and the components generally within a predetermined operating temperature range. According to one aspect of an embodiment of the present invention, by substantially controlling the amount of cooling fluid delivered to the components and the subsystems located in the racks 18a–18d based upon their respective heat loads, the power consumed by the cooling system 12 to supply the cooling fluid may also be controlled.

The cooling system 12 generally includes a fan 20 for supplying cooling fluid into the space 16 (e.g., plenum). Air is supplied into the fan 20 from the heated air in the data center 10 as indicated by arrows 22 and 24. In operation, the heated air enters into the cooling system 12 as indicated by arrow 22 and is cooled by operation of a cooling coil 26, a compressor 28, and a condenser 30, in any reasonably suitable manner generally known to those of ordinary skill in the lo art. In addition, based upon the cooling fluid needed by the heat loads in the racks 18a–8d, the cooling system 12 may be operated at various levels. For example, the capacity (e.g., the amount of work exerted on the refrigerant) of the compressor 28 and the speed of the fan 20 may both be modified to thereby control the temperature and the amount of cooling fluid flow delivered to the racks 18a–18d. In this respect, the compressor 28 is a variable capacity compressor and the fan 20 is a variable speed fan. The compressor 28 may thus be controlled to either increase or decrease the mass flow rate of a refrigerant therethrough. Because the specific type of compressor 28 and fan 20 to be employed with the embodiments of the invention may vary according to individual needs, the invention is not limited to any specific type of compressor or fan. Instead, any reasonably suitable type of compressor 28 and fan 20 that are capable of accomplishing certain aspects of the invention may be employed with the embodiments of the invention. The choice of compressor 28 and fan 20 may depend upon a plurality of factors, e.g., cooling requirements, costs, operating expenses, etc.

The cooling fluid generally flows from the fan 20 and into the space 16 (e.g., plenum) as indicated by the arrow 32. The cooling fluid flows out of the raised floor 14 through a plurality of dynamically controllable vents 34a–34c that generally operate to control the velocity and the volume flow rate of the cooling fluid therethrough. In one respect, the velocity and the volume flow rate of the cooling fluid may be regulated by varying the shape and/or opening size of the vents 34a–34c. Thus, according to this preferred embodiment of the invention, the racks 18a–18d may receive substantially individualized and localized amounts of cooling fluid according to their heat loads. The arrows 36 indicate the general direction of travel of the cooling fluid and the dashed arrows 38 indicate the general direction of travel of fluid heated by the heat dissipating components located within the racks 18a–18d. As may be seen in FIG. 1, the areas between the racks 18a–18d may comprise either cool aisles 40 or hot aisles 42, or a combination thereof. The cool aisles 40 are those aisles that include the vents 36a–36c and thus receive cooling fluid for delivery to the racks 18a–18d. The hot aisles 42 are those aisles that receive air heated by the heat dissipating components in the racks 18a–18d.

In addition, various sections of each of the racks 18a–18d may also receive substantially individualized amounts of cooling fluid. By way of example, if the bottom halves of the racks 18a and 18b are operating at maximum power, thereby dissipating a maximum level of heat load, and the upper halves are operating at little or no power, the vent 34c may be configured to enable cooling fluid flow therethrough to have a relatively high volume flow rate with a relatively low velocity. In this manner, the cooling fluid may operate to generally supply greater cooling to the lower halves of the racks 18a and 18b, whereas the upper halves receive relatively lesser amounts of cooling fluid. In addition, if the upper halves of the racks 18c and 18d are operating at approximately 50 percent of their maximum power, and the lower halves are operating at little or no power, the vent 34b may be configured to enable cooling fluid flow therethrough to have a relatively low volume flow rate with a relatively high velocity. In this manner, the cooling fluid flow may have sufficient momentum to adequately reach and cool the upper halves of the racks 18c and 18d.

Moreover, as the cooling requirements vary according to the heat loads in the racks 18a–18d, and the subsequent variations in the volume flow rate of the cooling fluid, the cooling system 12 may also vary the amount of cooling fluid supplied to the racks. As an example, if the heat load in the racks 18a–18d generally increases, the cooling system 12 may operate to increase the supply of cooling fluid. Alternatively, if the heat load in the racks 18a–18d generally decreases, the cooling system 12 may operate to decrease the supply of cooling fluid. The vents 34a–34c thus generally provide localized control of the cooling fluid flow to the racks 18a–18d and the cooling system 12 generally provides global control of the cooling fluid flow. In one respect, therefore, the amount of energy consumed by the cooling system 12 in maintaining the racks 18a–18d at a predetermined temperature range may be substantially reduced in comparison with conventional data center cooling systems.

According to an exemplary embodiment of the present invention, the cooling fluid supply for flow through each of the vents 34a–34c may be maintained at a relatively uniform pressure. In this respect, the space 16 may include a divider 44. The length of the divider 44 may extend substantially along the entire length of space 16, i.e., in the direction generally perpendicular to the plane of FIG. 1. The width of the divider 44 may be extend from the cooling system 12 to substantially the end of the space 16 to thus create a gap 46 between a side edge of the divider and a side surface of the space. The divider 44 generally divides the space 16 into two relatively separate chambers 48a, 48b. The first chamber 48a is in fluid communication with the outlet of the fan 20. The second chamber 48b is in fluid communication with the first chamber 48b substantially through the gap 46. In this respect, the cooling fluid flow originating from the fan must travel substantially the entire width of the space 16, i.e., through the first chamber 48a, for the fluid flow to enter into the second chamber 48b.

The cooling fluid in the second chamber 48b may be maintained at a substantially uniform static pressure by virtue of the manner in which the cooling fluid is introduced into the second chamber 48b. The rate at which the cooling fluid is supplied into the first chamber 48a by the fan 20 may cause a relatively large amount of turbulence in the cooling fluid located in the first chamber 48a. The turbulence is generally greatest at the outlet of the fan 20 and generally decreases as the distance from the outlet increases. By virtue of the distance the cooling fluid must travel to enter into the second chamber 48b, the cooling fluid may have substantially stabilized, thus enabling the cooling fluid entering into the second chamber 48b to be relatively calm. In this respect, the divider 44 operates to provide a relatively consistent cooling fluid pressure supply for the vents 34a–34c.

The pressure of the cooling fluid located in the second chamber 48b may be measured by a pressure sensor 50. In this respect, the pressure sensor 50 may detect any discernable changes in the pressure of the cooling fluid located within the second chamber 48b and relay that information to a cooling system controller (not shown). The cooling system controller may operate to alter the output of the fan 20 in response to the detected changes in pressure. Therefore, operation of the fan 20 may be related to the cooling requirements of the racks 18a–18d and the amount of energy required to supply the racks 18a–18d with cooling fluid may be substantially optimized. In one respect, only that amount of energy required to substantially cool the components contained in the racks 18a–18d may be expended, which may correlate to a substantial energy savings over known cooling systems.

The capacity of the compressor 28 may vary according to changes in the temperature of the cooling fluid located in the second chamber 48b. As such, a plenum temperature sensor 52 may be located within the second chamber 48b to relay temperature measurements to the cooling system 12. The plenum temperature sensor 52 may comprise any reasonably suitable temperature sensor known to those skilled in the art. Therefore, the compressor 28 may be operated to generally maintain the temperature of the cooling fluid within the second chamber 48b at a substantially constant level. In addition, the capacity of the compressor 28 may also vary according to detected and/or anticipated changes in heat loads generated in the racks 18a–18d. As an example, the compressor 28 capacity may be increased as the heat loads generated in the racks 18a–18d increase. In this regard, the power required to operate the compressor 28 may be substantially optimized, thereby reducing the total power required to operate the cooling system 12.

Figure 2A:
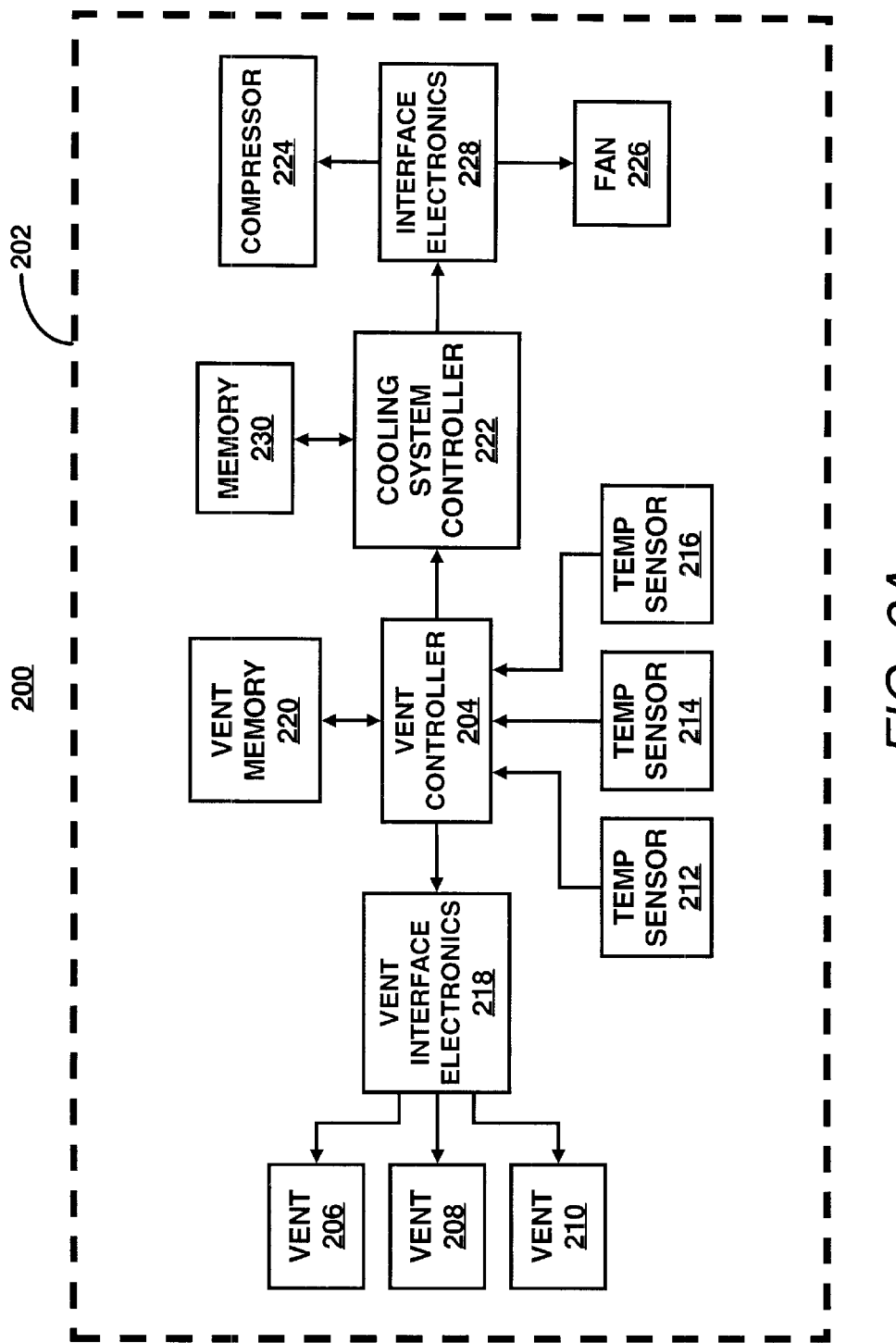
FIGS. 2A and 2B each illustrate a block diagram of an exemplary control scheme for a to cooling system according to various embodiments of the invention.

Referring to FIG. 2A, there is illustrated a block diagram 200 of a first exemplary control scheme for a cooling system 202 according to the present invention. The following description of the block diagram 200 is one manner in which the cooling system 202 may be operated. In this respect, it is to be understood that the following description of the block diagram 200 is but one manner of a variety of different manners in which such a cooling system 202 may be operated.

A vent controller 204 is generally configured to control the operation of the vents 206–210. In this regard, the vent controller 204 may comprise a microprocessor, a microcontroller, an application specific integrated circuit (ASIC), and the like. The manner in which the vent controller 204 operates the vents 206–210, i.e., the flow of cooling fluid therethrough, may be predicated upon the detected or anticipated temperatures of the racks 18a–18d or portions thereof. For example, with regard to detected temperatures, a plurality of temperature sensors 212–216, e.g., thermocouples, may be positioned at various positions around the subsystems and/or the racks 18a–18d. Each of the temperature sensors 212–216 may correspond to a respective one of the vents 206–210. By way of example, one temperature sensor 212 may affect the flow of cooling fluid flow through one vent 206. Alternatively, with regard to anticipated temperatures, anticipated cooling requirements for each of the racks 18a–18d and/or various sections of the racks may be predicated upon an impending load on the racks 18a–18d and/or sections of the racks. For example, the vent controller 204 may be connected to another controller, e.g., a central controller for the subsystems, which anticipates the heat load the components and/or the subsystems will dissipate. This information may be relayed to the vent controller 204 which may then manipulate the vents 206–210 according to the anticipated load.

Although FIG. 2A illustrates three temperature sensors 212–216, it should be understood that the number of temperature sensors is not critical to the operation of the exemplary embodiment of the invention. Instead, the cooling system 202 may include any reasonably suitable number of temperature sensors to thus measure the temperatures of any reasonably suitable number of racks 18a–18d or portions thereof. The number of temperature sensors and the temperature measurements of the number of racks may be upgradable, e.g., scalable, to include any additional components and/or racks that may be included in the data center.

If there is an actual detected change or an anticipated change in the temperature of the respective racks 18a–18d and/or portions thereof, the vent controller 204 generally operates to manipulate the corresponding vent 206–210 to compensate, i.e., changes the volume flow rate, velocity, and other similar characteristics of the cooling fluid, for the change in temperature. In this respect, each of the racks 18a–18d and/or portions thereof generally receives substantially only the amount of cooling fluid necessary to maintain the temperature of the portions of the racks within a predetermined temperature range. As will be seen from the discussion hereinbelow, by controlling the cooling fluid flow in this manner, the compressors 28 and fans 20 may be operated at substantially optimized levels, thereby decreasing the amount of energy and thus the operating costs required to operate these devices.

Vent interface electronics 218 may be provided to act as an interface between the vent controller 204 and the components, e.g., control the opening in the vents and the direction of cooling fluid flow through the vents, etc, for operating the vents 206–210.

The vent controller 204 may also be interfaced with a vent memory 220 configured to provide storage of a computer software that provides the functionality of the cooling system and may be executed by the vent controller. The memory 220 may also be configured to provide a storage for containing data/information pertaining to the manner in which each of the vents 206–210 may be manipulated in response to the detected and/or anticipated temperatures of the portions of the racks 18a–18d. In keeping with the example cited hereinabove, the vent controller 204 may operate the vent 206 to increase the volume flow rate and decrease the velocity of the cooling fluid flowing therethrough in response to a detected increase in the heat load of a lower portion of a corresponding rack. The memory 220 may be implemented as a combination of volatile and non-volatile memory, such as dynamic random access memory (DRAM), EEPROM, flash memory, and the like.

The vent controller 204 may be configured to relay data/information pertaining to the flow of cooling fluid through the vents 206–210 to a cooling system controller 222. The cooling system controller 222 is generally configured to control the operation of the cooling system 12, e.g., the compressor 224 and the fan 226. In this regard, the controller 222 may comprise a microprocessor, a microcontroller, ASIC, and the like.

Interface electronics 228 may be provided to act as an interface between the cooling system controller 222 and the components for operating the compressor 224 and the fan 226, e.g., the supply of voltage to vary the respective speeds of the compressor and the fan, direct control of the compressor and the fan, etc.

The cooling system controller 222 may also be interfaced with a memory 230 configured to provide storage of a computer software that provides the functionality of the cooling system 12, e.g., compressor 224 and fan 226, and may be executed by the cooling system controller. The memory 230 may also be configured to provide a storage for containing data/information pertaining to the manner in which the compressor 224 and the fan 226 may be manipulated in response to variations in the cooling fluid flow through the vents 206–210. In keeping with the example cited hereinabove, the cooling system controller 222 may operate the compressor 224 and the fan 226 to increase/decrease the volume flow rate of the cooling fluid flow in response to various degrees of detected increases/decreases in the volume flow rate through the valves 206–210. More particularly, a look up table (not shown) may be stored in the memory 230. By way of example, the look up table may include information pertaining to the level of compressor 224 speed and fan 226 output increase necessary for a detected increase in the volume flow rate. In this respect, the compressor 224 speed and the fan 226 output may be varied substantially incrementally in response to detected changes in the volume flow rate. The memory 230 may be implemented as a combination of volatile and non-volatile memory, such as dynamic random access memory (DRAM), EEPROM, flash memory, and the like.

Although FIG. 2A illustrates a single vent controller 204 configured to operate the vents 206–210, it should be understood that a plurality of vent controllers may be implemented to perform the functions of the vent controller 204 without deviating from the scope and spirit of the present invention.

Figure 2B:
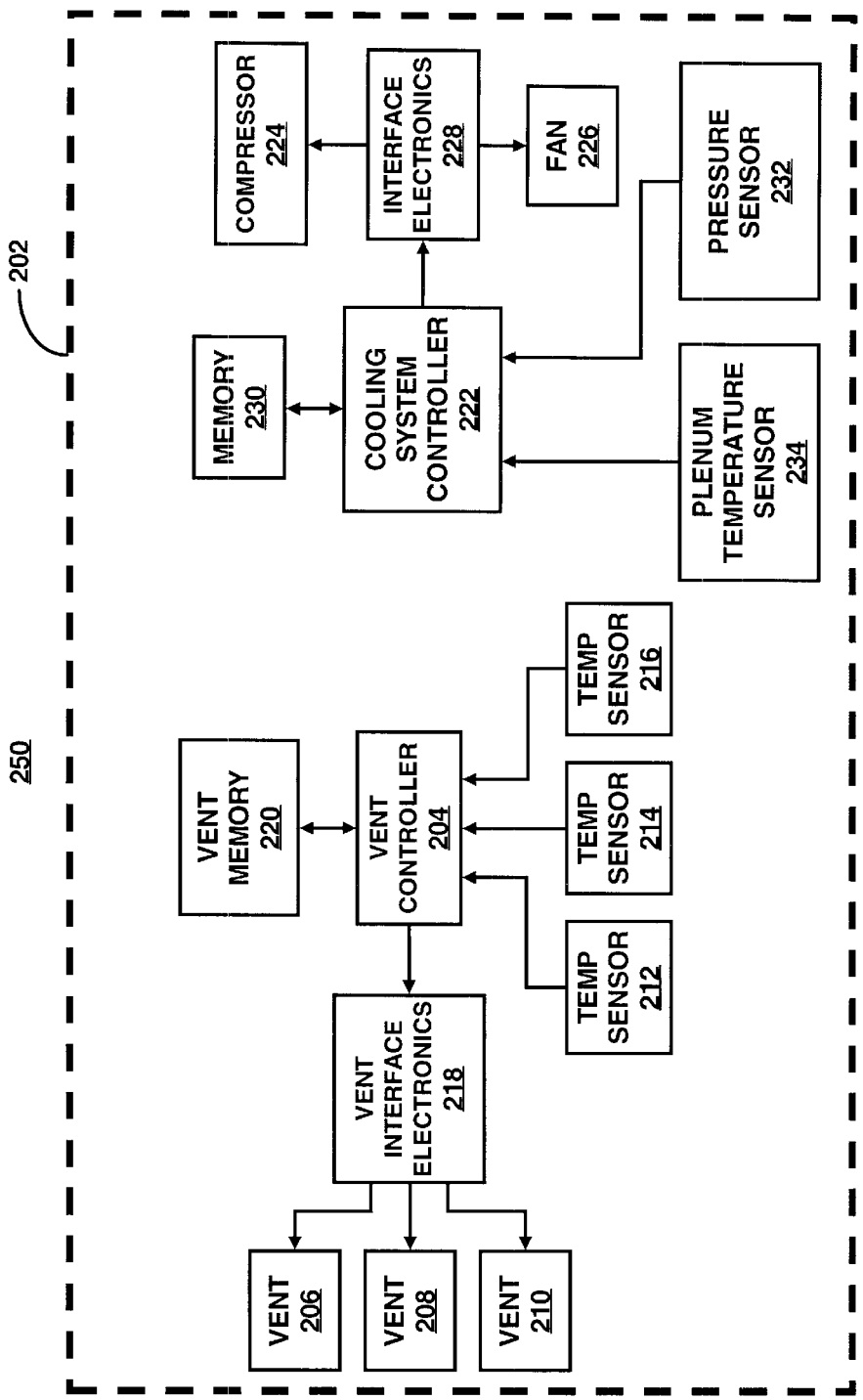

In FIG. 2B, there is illustrated a block diagram 250 of a second exemplary control scheme for a cooling system 202 according to the present invention. The elements illustrated in the block diagram 250 operate in substantially the same manner as those elements illustrated in the block diagram

200. However, one difference lies in the substantially independent operability of the cooling system controller 222. That is, operation of the cooling system controller 222 may not be directly related to the operation of the vent controller 204. Because of the apparent similarities between the block diagrams 200 and 250, only those elements that differ between the block diagrams will be described hereinbelow.

A pressure sensor 232 is configured to measure the pressure within the second chamber 48b of the space 16 (e.g., plenum) as described hereinabove. The pressure measurements and/or any discernable changes in the pressure measurements obtained by the pressure sensor 232 may be relayed to the cooling system controller 222. In addition, a plenum temperature sensor 234 may be configured to measure the temperature of the fluid within the second chamber 48b. The temperature measurements and/or any discernable changes in the temperature obtained by the plenum temperature sensor may also be relayed to the cooling system controller 222.

The cooling system controller 222 may manipulate the capacity of the compressor 224 based upon the measured temperature of the fluid. That is, the temperature of the fluid within the second chamber 48b may be maintained at a substantially constant level by manipulation of the compressor. Further, the output of the fan 226 may be manipulated based upon the measured pressure of the fluid in the second chamber 48b to vary the amount of cooling fluid supplied to space 16, to thereby substantially maintain the pressure of the cooling fluid within the second chamber 48b at a substantially uniform level. Thus, the cooling system controller 222 is operable to increase the speed of the compressor 224 and the fan 226 output, e.g., expend a greater amount of energy, substantially as the heat loads in the racks 18a–18d requires such an increase. Consequently, the compressor 224 and the fan 226 are not operated at a substantially constant energy level and the amount of energy necessary is substantially lower than that of conventional cooling systems that typically operate at maximum energy levels.

The memory 230 may also be configured to store data/information pertaining to the control of the compressor 224 speed and the output of the fan 226 corresponding to the measured pressure with the second chamber 48b. For example, the cooling system controller 222 may increase the compressor 224 speed and fan 226 output by a relatively large amount in response to a relatively large decrease in the measured pressure. In this respect, the pressure within the second chamber 48b may be maintained at a substantially uniform level even when the pressures change by a relatively sharp amount.

Figure 3A:
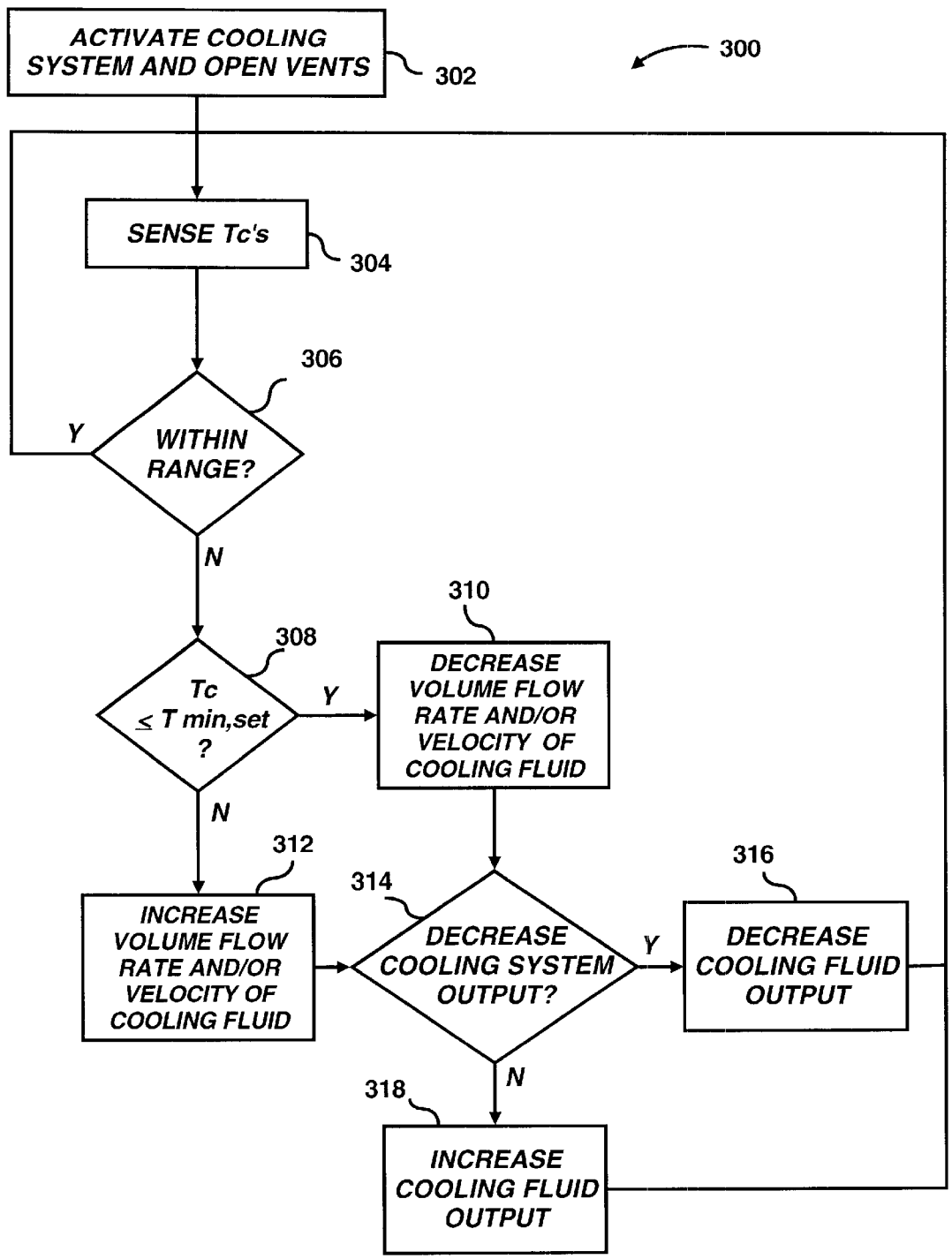
FIGS. 3A and 3B each show a flow diagram of a first and second manner in which exemplary embodiments of the invention may be practiced.

FIG. 3A shows a flow diagram 300 of a first manner in which an embodiment of the present invention may be practiced. The following description of the flow diagram 300 is made with reference to the block diagram 200 illustrated in FIG. 2A, and thus makes reference to the elements cited therein. It is to be understood that the steps illustrated in the flow diagram 300 may be contained as a utility, program, subprogram, in any desired computer accessible medium. In addition, the flow diagram 300 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 300, the cooling system 202 is activated and the vents 206–210 are opened at step 302. The temperature of a component (Tc) generally corresponds to the heat load of the heat dissipating components and therefore the subsystems contained in the racks 18a–18d. Therefore, the Tc's may be based upon the temperatures of specific heat dissipating components and subsystems. In addition, the Tc's may be based upon the temperatures in the general vicinity of the racks and/or sections of the racks. Thus, those skilled in the art will understand that certain embodiments of the present invention may be employed with the temperature sensors 212–214 located at various positions throughout the data center. Moreover, use of the term "rack" herein generally refers additionally to sections of the racks and thus may not necessarily refer to an entire rack. Thus, the use of the term "rack" throughout the present disclosure is not meant to limit certain aspects to entire racks, but instead, is implemented to simplify the description of certain embodiments of the present invention.

At step 304, the temperatures of the components (Tc's) are individually sensed by the temperature sensors 212–216. Alternatively, the Tc's may be anticipated in the manner described hereinabove with respect to FIG. 2A. At step 306, it is determined whether each of the measured temperatures are individually within a predetermined range of operating temperatures, e.g., between a maximum set point temperature (Tmax,set) and a minimum set point temperature (Tmin,set). The predetermined range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another on the basis that various subsystems generally may operate effectively at various temperatures.

The measured and/or anticipated temperatures for those racks determined to have heat loads that fall within the predetermined range of operating temperatures, are sensed again at step 304. For those racks determined to have heat loads that do not fall within the predetermined temperature range, i.e., fall outside of Tmin,set and Tmax,set, it is determined whether the sensed temperature equals or falls below the Tmin,set at step 308. In general, the range of temperatures Tmin,set and Tmax,set pertains to threshold temperatures to determine whether to increase or decrease the flow of cooling fluid delivered to the racks. The predetermined temperature range may be based upon a plurality of factors, for example, a threshold operating range of temperatures that may be determined through testing to substantially optimize the performance of the subsystems contained in the racks. Moreover, the predetermined temperature range may vary for each rack because various components generally may operate effectively at various temperatures and thus various threshold temperatures may be optimal.

If the Tc's of some of the racks are below or equal to the Tmin,set, the vent controller 204 may operate to decrease the volume flow rate and/or the velocity of cooling fluid to those racks at step 310. The determination of whether to decrease either or both the volume flow rate and the velocity of the cooling fluid may be based upon the detected temperature of the racks. For example, if the subsystems on a bottom half of a rack are operating at 50 percent of maximum capacity, and the subsystems on an upper half of the rack are operating at or near zero capacity, the velocity of the cooling fluid may be reduced whereas the volume flow rate may remain substantially constant. This may occur, for example, because the cooling fluid need not travel a relatively long distance but may still need to supply the bottom half with a sufficient amount of cooling fluid.

If the Tc's of some of the racks exceed the Tmin,set (i.e., also exceed the Tmax,set), the vent controller 204 may operate to increase the volume flow rate and/or the velocity of cooling fluid to those racks at step 312. The determination of whether to increase either or both the volume flow rate and the velocity of the cooling fluid may be based upon the detected temperature of the racks. For example, if the subsystems on the top half of a rack are operating at 100 percent capacity, and the subsystems on a bottom half of the rack are operating at or near zero capacity, the velocity and the volume flow rate of the cooling fluid may both be increased. This may occur, for example, because the cooling fluid must travel a relatively long distance and supply the top half with a sufficient amount of cooling fluid.

According to an exemplary embodiment of the invention, the decrease in volume flow rate and/or velocity of the cooling fluid flow at step 310 and the increase in volume and/or velocity of the cooling fluid at step 312 may be accomplished by incrementally varying the cooling fluid flow through the vents. An example will be made for the instance where a vent allows a certain amount of cooling fluid to flow therethrough, and the vent is manipulated to decrease the volume flow rate of the cooling fluid, and where the decrease in fluid flow is insufficient to cause the Tc for that rack to fall within the predetermined range. In this instance, during a subsequent run through steps 204–210, the vent may be controlled to further decrease the volume flow rate of the cooling fluid therethrough by an incremental amount. By repeating this process a number of times, the temperature of the rack may be substantially brought within the predetermined range.

At step 314, the cooling system controller 222 may determine whether to decrease the cooling fluid output, e.g., decrease the compressor 224 speed and the fan 226 output. The determination of whether to decrease the cooling fluid output may be made in response to the manipulations made to the vents 206–210 by the vent controller 204. For instance, if the total amount of decreases in the volume flow rates of the cooling fluid exceeds the total amount of increases in the volume flow rates flow of the cooling fluid, the cooling system controller 222 may operate to decrease the cooling fluid output at step 316. Alternatively, if the total amount of increases in the volume flow rates of the cooling fluid exceeds the total amount of decreases, the cooling system controller 222 may operate to increase the cooling system output at step 318.

Following steps 316 or 318, or if the increases in the volume flow rates of the cooling fluid through the vents equals the decreases, for example, the Tc's are sensed again at step 304. In addition, the steps following step 304 may be repeated for an indefinite period of time so long as the cooling system 202 is in operation.

It should be appreciated that the Tc's of some of the racks may fall below the Tmin,set, whereas the Tc's of other racks may exceed the Tmax,set. Thus, it should be appreciated that steps 310 and 312 may be respectively and substantially simultaneously performed on the various racks.

Figure 3B:
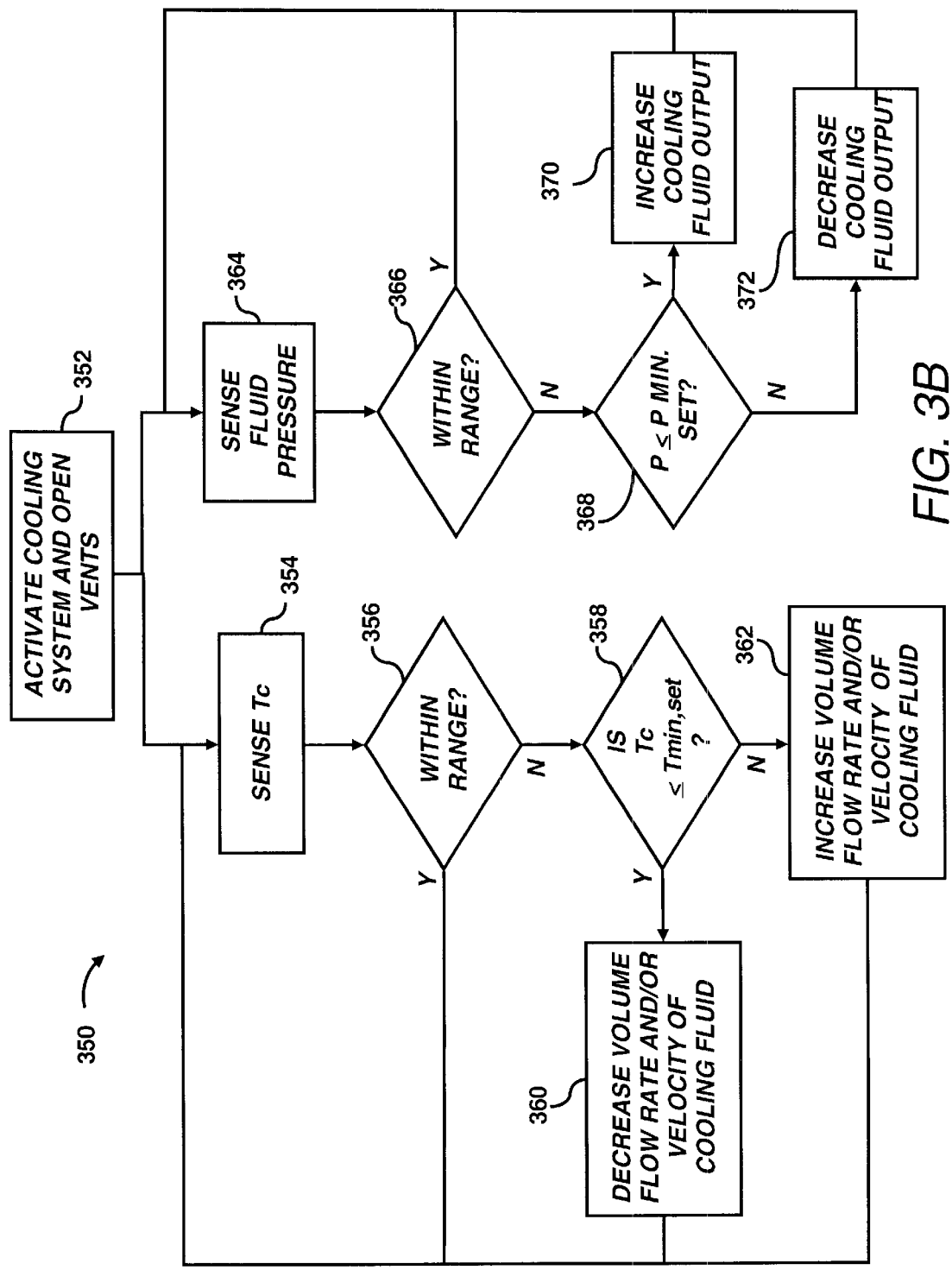

FIG. 3B shows a flow diagram 350 of a second manner in which another embodiment of the present invention may be practiced. The following description of the flow diagram 350 is made with reference to the block diagram 250 illustrated in FIG. 2B, and thus makes reference to the elements cited therein. It is to be understood that the steps illustrated in the flow diagram 350 may be contained as a utility, program, subprogram, in any desired computer accessible medium. In addition, the flow diagram 350 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 350, steps 352–362 respectively correspond to steps 302–312 recited hereinabove with respect to the flow diagram 300 illustrated in FIG. 2A. Therefore, a detailed description of steps 352–362 will not be made herein. Instead, one of ordinary skill in the art will readily recognize that the description made hereinabove with respect to steps 302–312 has general applicability to steps 352–362 and may thus be used interchangeably.

Therefore, beginning at step 364, the pressure of the cooling fluid supplying the vents 206–210 may be measured by a pressure sensor 232. The measured pressure may be relayed to the cooling system controller 222. The cooling system controller 222 may determine whether the measured pressure is within a predetermined pressure range, e.g., a predetermined minimum set point pressure (Pmin,set) and a predetermined maximum set point pressure (Pmax,set), at step 366. The predetermined pressure range may be set according to a maximum desired volume flow rate and/or velocity of the cooling fluid to be ejected through the vents 206–210. In addition, the predetermined pressure range may be the substantial optimum operating pressure desired for controlling the flow of cooling fluid through the vents. If the measured pressure is within the predetermined pressure range, the cooling system controller 222 returns to step 364.

If the measured pressure is not within the predetermined pressure range, it is determined whether the measured pressure (P) is below or equal to a minimum pressure set point (Pmin,set) at step 368. In general, the predetermined pressure range pertains to the threshold pressures to determine whether to increase or decrease the supply of fluid, e.g., in the second chamber 48*b*. The predetermined pressure range may be based upon a plurality of factors, for example, a threshold operating pressure or range of pressures that may be determined through testing to substantially optimize the performance of the cooling fluid output through the vents 206–210.

If the P is determined to be below or equal to the Pmin,set, the cooling system controller 222 may operate to increase the cooling fluid output, e.g., by increasing the compressor capacity and/or the fan output, at step 370. Otherwise, if the P is determined to exceed the Pmin,set, and thereby exceed the Pmax,set, the cooling system controller 222 may operate to decrease cooling fluid output, e.g., by decreasing the compressor capacity and/or the fan output, at step 372.

Following steps 370 or 372, the cooling system controller 222 returns to step 364. In addition, the steps following step 364 may be repeated for an indefinite period of time so long as the cooling system 202 is in operation.

It should be appreciated that the Tc's of some of the racks may fall below the Tmin,set, whereas the Tc's of other racks may exceed the Tmax,set. Thus, steps 360 and 362 may be respectively and substantially simultaneously performed on the various racks.

Figure 4:
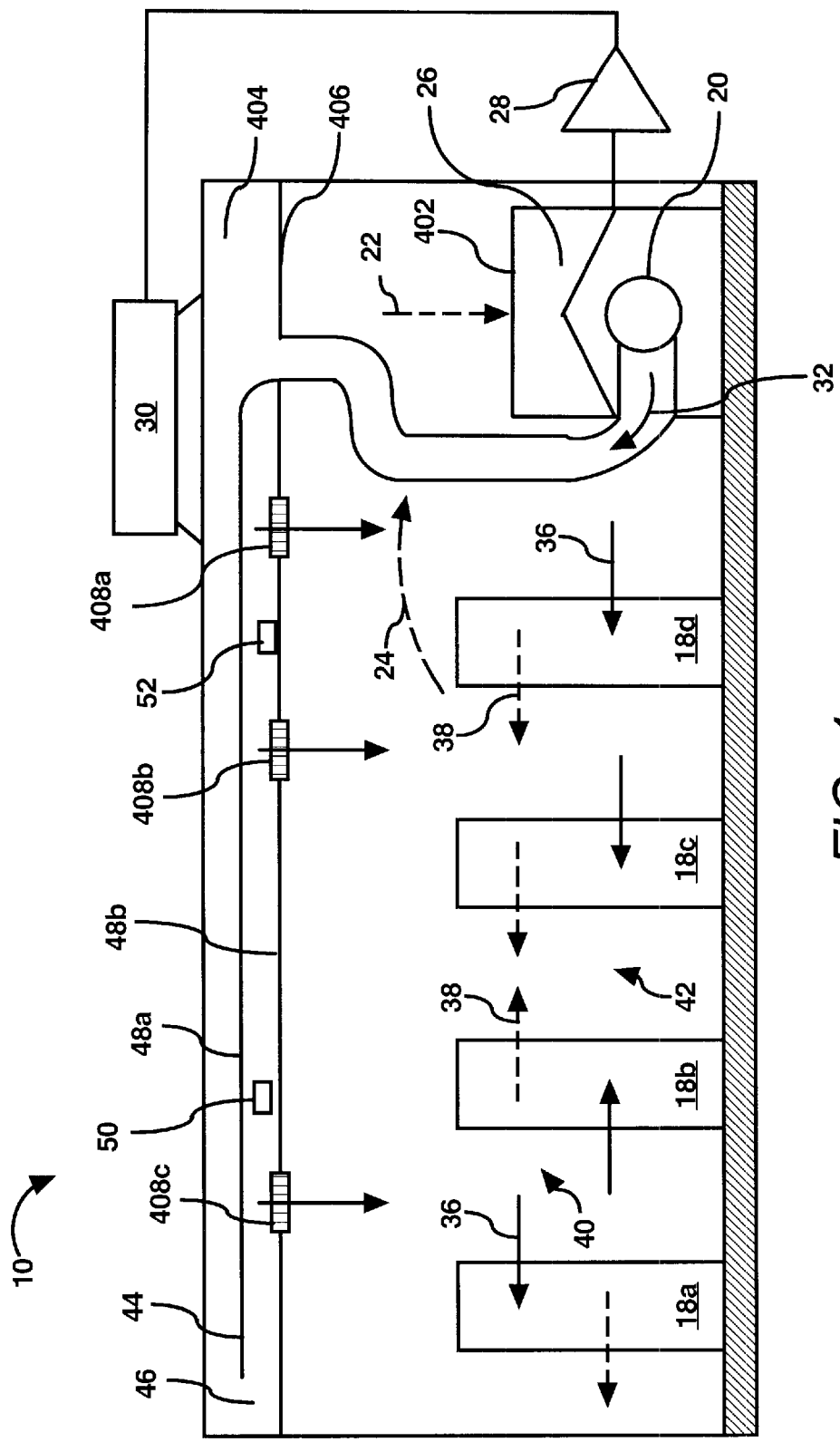
FIG. 4 shows a simplified schematic illustration of the data center illustrated in FIG. 1 containing a cooling system in accordance with an alternate embodiment of the present invention.

FIG. 4 illustrates an alternate exemplary embodiment of the present invention. As shown in FIG. 4, the data center 10 includes a cooling system 402 configured to supply cooling fluid, e.g., air through a space 406 (e.g., plenum) located above a lowered ceiling 404. This embodiment operates in a similar manner to the embodiments illustrated in FIGS. 1, 2A–2B, and 3A–3B. The difference between the embodiment illustrated in FIG. 4 and those embodiments is that the cooling fluid is supplied from above the racks 18*a*–18*d*. It should be understood that the vents 406*a*–406*c* operate to supply cooling fluid to the racks 18*a*–18*d* in much the same manner as that described hereinabove with respect to FIGS. 1, 2A–2B, and 3A–3B. Therefore, the description set forth hereinabove with respect to the above-described embodiments are relied upon to provide a description of the embodiment illustrated in FIG. 4.

In accordance with an exemplary embodiment of the present invention, the cooling requirements within a data center may be analyzed to substantially optimize the layout of the racks within the data center. In one respect, the substantial optimization of the rack layout in the data center may enable the cooling system of the data center to operate at generally lower energy and greater efficiency levels by virtue of the reduced workload placed on the components of the cooling systems, e.g., compressors, fans, etc. The cooling requirements within the data center may be analyzed by operation of any reasonably suitable commercially available computational fluid dynamics (CFD) tool, e.g., FLOVENT, a 3-D modeling software capable of predicting temperature variations based upon fluid flows. By virtue of the numerical modeling, various air conditioning units as well as the vents described hereinabove may be positioned throughout the data center to substantially control the manner in which the racks receive the cooling fluid. In addition, the air conditioning units may also be positioned to substantially maximize and optimize their performances, e.g., to prevent one or more of the air conditioning units from being overworked.

In determining the cooling fluid distribution requirement within the data center, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 20 subsystems may have a maximum heat load of 5 KW. By implementing the CFD in this manner, for example in a data center containing 100 racks and four air conditioning units, racks having a potential for relatively larger heat loads may be relatively separately located throughout the data center. In one respect, therefore, the air conditioning units within the data center may be operated at substantially less than maximum power levels and the racks may receive sufficient amounts of cooling fluid. More specifically, the power required to operate the air conditioning units may be regulated to efficiently cool the fluid supplied to the racks by providing substantially only that amount of cooling fluid necessary to maintain the racks within normal operating temperatures.

According to another exemplary embodiment of the present invention, a CFD tool may be implemented substantially continuously with the embodiments described hereinabove with respect to FIGS. 1–4. More specifically, the CFD tool may be utilized to substantially continuously vary the operation of the cooling system to operate according to the heat loads generated in the racks. In this regard, the anticipated or actual heat loads (e.g., based upon the power draw of the components) on the racks may be inputted into the CFD tool, along with one or more of the following properties: velocity of the cooling fluid flowing through various sections of the data center and the distribution of temperature and pressure of the cooling fluid in the data center, to determine an optimal manner in which the air conditioning units may be operated as well as the flow of the cooling fluid through the vents to adequately cool the racks based upon an analysis of the data center layout and the heat loads. The CFD tool may be implemented to produce a numerical model of the data center to thus determine an optimized cooling distribution within the data center. A correlation of one or more of the following properties: velocity of the cooling fluid flowing through various sections of the data center, distribution of temperature and pressure of the cooling fluid in the data center, and the power draw into the racks, may be created based on the numerical modeling. The correlation may be used to infer thermal conditions throughout the data center when only a minimum number of sensors are available during operation of the cooling system. In addition, the correlation may substantially reduce the amount of time required for the CFD tool to perform the computing operations.

Thus, for example, with respect to FIG. 3A, at step 312, a numerical model may be created to analyze an optimal manner in which the volume flow and/or the velocity of the cooling fluid may be increased while considering the effects of fluid flow from other racks. In this respect, based upon the analysis, the vent supplying that rack with cooling fluid and/or another vent may be caused to vary the volume flow and/or velocity of the cooling fluid. In addition, at step 314, the numerical model may be created to determine whether the cooling system output should be decreased based upon the heat loads and the fluid flow throughout the data center. For example, if it is determined that a rack with an increasing heat load may receive a sufficient amount of cooling fluid by receiving cooling fluid from a vent generally away therefrom, the cooling system output may not be increased. Thus, by implementation of the CFD tool to generally analyze the fluid flow characteristics and the temperatures of the racks, the amount of energy required to sufficiently cool the racks in the data center may be substantially optimized.

By virtue of certain aspects of the present invention, one of ordinary skill in the art will readily recognize that the amount of energy, and thus the costs associated with cooling the racks located within a data center may be substantially reduced. In one respect, by operating the cooling system to supply cooling fluid substantially only as needed by the racks, the cooling system may be operated at a relatively more efficient manner as compared to conventional cooling systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A smart cooling system for cooling racks in a data center, said system comprising:
    a cooling device for supplying cooling fluid to said racks, said cooling device including a variable output fan;
    a plenum having an inlet and a plurality of outlets, wherein said inlet of said plenum is in fluid communication with said fan;
    a plurality of vents in fluid communication with said plurality of outlets for delivering said cooling fluid to said racks, wherein said vents are operable to vary a characteristic of said cooling fluid delivered to said racks through said vents;
    at least one vent controller operable to control at least one of said vents, wherein said at least one vent controller is configured to independently control one or more of said vents to thereby independently vary said characteristic of said cooling fluid delivered through said vents;
    a variable capacity compressor; and
    a cooling device controller operable to control the speed of said compressor and said output of said fan to thereby vary the output of said cooling fluid from said cooling device in response to signals received from said at least one vent controller and thereby vary the cooling fluid supply in said plenum.

2. The system according to claim 1, wherein said characteristic of said cooling fluid comprises at least one of volume flow rate and velocity.

3. The system according to claim 1, further comprising:
    a plurality of temperature sensors configured to measure a temperature of one or more of said racks, wherein said at least one vent controller is configured to independently control one or more of said vents in response to said measured temperatures of one or more of said racks.

4. The system according to claim 1, wherein said at least one vent controller is operable to independently control one or more of said vents on the basis of an anticipated amount of heat predicted to be generated by one or more of said racks.

5. A smart cooling system for cooling racks in a data center, said system comprising:
    a cooling device for supplying cooling fluid to said racks, said cooling device including a variable output fan;
    a plenum having an inlet and a plurality of outlets, wherein said inlet of said plenum is in fluid communication with said fan;
    a plurality of vents in fluid communication with said plurality of outlets for delivering said cooling fluid to said racks, wherein said vents are operable to vary a characteristic of said cooling fluid delivered to said racks through said vents;
    at least one vent controller operable to control at least one of said vents, wherein said at least one vent controller is configured to independently control one or more of said vents to thereby independently vary said characteristic of said cooling fluid delivered through said vents;
    a cooling device controller operable to control the output of said cooling device; and
    a pressure sensor situated within said plenum to measure the pressure of said cooling fluid located within said plenum,
    wherein said cooling device controller is operable to vary the output of said cooling fluid from said cooling device in response to the measured pressure of said cooling fluid in said plenum.

6. The system according to claim 5, wherein said characteristic of said cooling fluid comprises at least one of volume flow rate and velocity.

7. The system according to claim 5, further comprising:
    a plurality of temperature sensors configured to measure a temperature of one or more of said racks, wherein said at least one vent controller is configured to independently control one or more of said vents in response to said measured temperatures of one or more of said racks.

8. The system according to claim 5, wherein said at least one vent controller is operable to independently control one or more of said vents on the basis of an anticipated amount of heat predicted to be generated by one or more of said racks.

9. A smart cooling system for cooling racks in a data center, said system comprising:
    a cooling device for supplying cooling fluid to said racks, said cooling device including a variable output fan;
    a plenum having an inlet and a plurality of outlets, wherein said inlet of said plenum is in fluid communication with said fan;
    a plurality of vents in fluid communication with said plurality of outlets for delivering said cooling fluid to said racks, wherein said vents are operable to vary a characteristic of said cooling fluid delivered to said racks through said vents; and
    at least one vent controller operable to control at least one of said vents, wherein said at least one vent controller is configured to independently control one or more of said vents to thereby independently vary said characteristic of said cooling fluid delivered through said vents,
    wherein said plenum includes a divider, said divider being operable to divide said plenum into a first chamber and a second chamber.

10. The system according to claim 9, wherein said first chamber is in fluid communication with said cooling device and said second chamber is in fluid communication with said vents, and wherein said divider operates to maintain the pressure of said cooling fluid in said second chamber at a substantially uniform pressure.

11. The system according to claim 9, wherein said characteristic of said cooling fluid comprises at least one of volume flow rate and velocity.

12. The system according to claim 9, further comprising:
a plurality of temperature sensors configured to measure a temperature of one or more of said racks, wherein said at least one vent controller is configured to independently control one or more of said vents in response to said measured temperatures of one or more of said racks.

13. The system according to claim 9, wherein said at least one vent controller is operable to independently control one or more of said vents on the basis of an anticipated amount of heat predicted to be generated by one or more of said racks.

14. A method of cooling a plurality of racks in a data center, said method comprising:
activating a cooling system and opening a plurality of vents, each of said vents being configured to vary the supply cooling fluid to at least one of said racks;
sensing the temperatures of said racks;
determining whether said sensed temperatures are within a predetermined temperature range;
varying said supply of said cooling fluid to one or more of said racks in response to said sensed temperatures;
sensing a pressure of a supply of said cooling fluid;
determining whether said sensed pressure is within a predetermined pressure range; and
varying an output of said cooling system in response to said sensed pressure falling outside of said predetermined pressure range.

15. The method according to claim 14, further comprising:
determining whether the measured temperatures of said racks are below or equal to a predetermined minimum set point temperature;
decreasing the supply of said cooling fluid to said racks having measured temperatures that fall below or equal said predetermined minimum set point temperature; and
increasing the supply of said cooling fluid to said racks having measured temperatures that exceed said predetermined minimum set point temperature.

16. The method according to claim 15, further comprising:
decreasing an output of said cooling fluid from said cooling system in response to said decrease in cooling fluid supply to said racks exceeding said increase in cooling fluid supply to said racks.

17. The method according to claim 15, further comprising:
increasing an output of said cooling fluid from said cooling system in response to said decrease in cooling fluid supply to said racks falling below said increase in cooling fluid supply to said racks.

18. The method according to claim 14, wherein said step of varying said cooling system output includes determining whether said measured pressure falls below or equals a predetermined minimum set point pressure.

19. The method according to claim 18, further comprising:
increasing the output of said cooling system in response to said measured pressure falling below or equaling said predetermined minimum set point pressure.

20. The method according to claim 18, further comprising:
decreasing the output of said cooling system in response to said measured pressure exceeding said predetermined minimum set point pressure.

21. The method according to claim 15, further comprising:
performing a numerical modeling of a temperature distribution and flow characteristics of the data center; and
manipulating said cooling system in response to said numerical modeling.

22. The method according to claim 21, further comprising:
implementing said numerical modeling to correlate at least two of temperature, velocity and pressure of said cooling fluid and power draw of said racks within said data center to thereby infer a thermal condition throughout said data center, wherein said manipulating step further comprises manipulating said cooling system in response to said inferred thermal condition.

23. A data center housing a plurality of racks, said data center comprising:
a raised floor having a plurality of vents;
a plenum located beneath said raised floor;
a cooling system having a variable capacity compressor and a variable output fan, said cooling system being configured to supply a cooling fluid into said plenum;
said plenum being in fluid communication with said plurality of vents, said vents being configured to deliver said cooling fluid to said racks, wherein said vents are operable to vary a characteristic of said cooling fluid delivered through each of said vents;
a divider positioned within said plenum and operable to divide said plenum into a first chamber and a second chamber;
wherein said first chamber of said plenum is in fluid communication with said cooling system and said second chamber is in fluid communication with said vents, and wherein said divider operates to maintain the pressure of said cooling fluid in said second chamber at a substantially uniform pressure;
at least one vent controller operable to control at least one of said vents, wherein said at least one vent controller is configured to independently control said vents to thereby independently vary said characteristic of said cooling fluid flow through said vents; and
a cooling system controller operable to control a speed of said compressor and an output of said fan to thereby vary the output of said cooling fluid from said cooling system to thereby vary the cooling fluid supply in said plenum.

24. A computer readable storage medium on which is embedded one or more computer programs, said one or more computer programs implementing a method for cooling a plurality of racks in a data center, said one or more computer programs comprising a set of instructions for:
activating a cooling system and opening a plurality of vents, each of said vents being configured to vary the supply cooling fluid to at least one of said racks;
sensing the temperatures of said racks;
determining whether said sensed temperatures are within a predetermined temperature range;
varying said supply of said cooling fluid to one or more of said racks in response to said sensed temperatures;
sensing a pressure of a supply of said cooling fluid;
determining whether said sensed pressure is within a predetermined pressure range; and varying an output of said cooling system in response to said sensed pressure falling outside of said predetermined pressure range.

25. The computer readable storage medium according to claim 24, said one or more computer programs further comprising a set of instructions for:

determining whether the measured temperatures of said racks are below or equal to a predetermined minimum set point temperature;

decreasing the supply of said cooling fluid to said racks having measured temperatures that fall below or equal said predetermined minimum set point temperature; and increasing the supply of said cooling fluid to said racks having measured temperatures that exceed said predetermined minimum set point temperature.

26. The computer readable storage medium according to claim 25, said one or more computer programs further comprising a set of instructions for:

decreasing an output of said cooling fluid from said cooling system in response to said decrease in cooling fluid supply to said racks exceeding said increase in cooling fluid supply to said racks.

27. The computer readable storage medium according to claim 25, said one or more computer programs further comprising a set of instructions for:

increasing an output of said cooling fluid from said cooling system in response to said decrease in cooling fluid supply to said racks falling below said increase in cooling fluid supply to said racks.

28. The computer readable storage medium according to claim 25, said one or more computer programs further comprising a set of instructions for:

performing a numerical modeling of a temperature distribution and flow characteristics of the data center; and manipulating said cooling system in response to said numerical modeling.

29. The computer readable storage medium according to claim 28, said one or more computer programs further comprising a set of instructions for:

implementing said numerical modeling to correlate at least two of temperature, velocity and pressure of said cooling fluid and power draw of said racks within said data center to thereby infer a thermal condition throughout said data center, wherein said manipulating step further comprises manipulating said cooling system in response to said inferred thermal condition.

* * * * *